(12) United States Patent
Kogure et al.

(10) Patent No.: US 8,994,394 B2
(45) Date of Patent: Mar. 31, 2015

(54) TEST CARRIER

(75) Inventors: Yoshinari Kogure, Saitama (JP);
Takashi Fujisaki, Gunma (JP); Kiyoto Nakamura, Miyagi (JP)

(73) Assignee: Advantest Corporation, Tokyo (JP)

( * ) Notice: Subject to any disclaimer, the term of this patent is extended or adjusted under 35 U.S.C. 154(b) by 267 days.

(21) Appl. No.: 13/448,911

(22) Filed: Apr. 17, 2012

(65) Prior Publication Data

US 2012/0268156 A1    Oct. 25, 2012

(30) Foreign Application Priority Data

Apr. 20, 2011   (JP) .................................. 2011-093867
Oct. 27, 2011   (JP) .................................. 2011-236483

(51) Int. Cl.
*G01R 31/00*    (2006.01)
*G01R 1/04*     (2006.01)
*G01R 31/28*    (2006.01)

(52) U.S. Cl.
CPC .......... *G01R 1/0408* (2013.01); *G01R 31/2893* (2013.01)
USPC ............ 324/756.02; 324/756.04; 324/756.05; 257/48

(58) Field of Classification Search
CPC ........ G01R 1/0483; G01R 1/04; G01R 31/20; G01R 1/0408; G01R 31/2893; G01R 31/00; G06K 19/077
USPC ........................... 324/756.02–756.05; 257/48
See application file for complete search history.

(56) References Cited

U.S. PATENT DOCUMENTS

| | | | |
|---|---|---|---|
| 5,355,079 A | | 10/1994 | Evans et al. |
| 5,468,157 A | | 11/1995 | Roebuck et al. |
| 5,672,908 A | | 9/1997 | Fujitsu |
| 5,757,199 A | | 5/1998 | Maruyama |
| 5,767,689 A | | 6/1998 | Tokuno et al. |
| 5,828,224 A | | 10/1998 | Maruyama |
| 5,986,459 A | * | 11/1999 | Fukaya et al. ........... 324/756.02 |
| 6,049,215 A | | 4/2000 | Agahdel et al. |
| 6,127,833 A | | 10/2000 | Wu et al. |
| 6,445,200 B2 | | 9/2002 | Haseyama |
| 6,492,829 B1 | | 12/2002 | Miura et al. |
| 6,639,416 B1 | | 10/2003 | Akram et al. |
| 6,753,614 B2 | | 6/2004 | Yamazaki et al. |
| 6,876,073 B2 | | 4/2005 | Miura et al. |

(Continued)

FOREIGN PATENT DOCUMENTS

| | | |
|---|---|---|
| JP | 7-263504 | 10/1995 |
| JP | 8-172117 | 7/1996 |

(Continued)

OTHER PUBLICATIONS

U.S. Appl. No. 13/502,655 to Kiyoto Nakamura et al., filed Apr. 18, 2012.

(Continued)

*Primary Examiner* — Tung X Nguyen
*Assistant Examiner* — Son Le
(74) *Attorney, Agent, or Firm* — Greenblum & Bernstein, P.L.C.

(57) ABSTRACT

A test carrier includes a film-shaped base film which has first bumps which contact test pads of a die; and a cover film which is superposed over the base film, and the test carrier holds the die between the base film and the cover film. The first bumps are relatively higher than second bumps which the die has.

5 Claims, 7 Drawing Sheets

(56) References Cited

U.S. PATENT DOCUMENTS

| | | |
|---|---|---|
| 6,924,211 B2 | 8/2005 | Yamazaki et al. |
| 6,972,486 B2 | 12/2005 | Lam et al. |
| 7,463,496 B2 | 12/2008 | Robinson et al. |
| 7,534,045 B2 | 5/2009 | Nakajima et al. |
| 7,838,975 B2 | 11/2010 | Chen |
| 2002/0140063 A1 | 10/2002 | Yamazaki et al. |
| 2002/0140093 A1 | 10/2002 | Yamazaki et al. |
| 2003/0020158 A1 | 1/2003 | Miura et al. |
| 2003/0140485 A1 | 7/2003 | Yamazaki et al. |
| 2003/0226640 A1 | 12/2003 | Yamazaki et al. |
| 2004/0012098 A1 | 1/2004 | Yamazaki et al. |
| 2005/0093558 A1* | 5/2005 | Hembree ............... 324/755 |
| 2005/0282313 A1* | 12/2005 | Akram et al. ........... 438/108 |
| 2007/0189568 A1 | 8/2007 | Wilk et al. |
| 2012/0205143 A1 | 8/2012 | Komoto |

FOREIGN PATENT DOCUMENTS

| | | |
|---|---|---|
| JP | 10-68758 | 3/1998 |
| KR | 0165154 | 2/1999 |
| TW | 256395 | 9/1995 |
| TW | 544734 | 8/2003 |
| TW | 546682 | 8/2003 |
| WO | 2010/109739 | 9/2010 |

OTHER PUBLICATIONS

U.S.A. (U.S. Appl. No. 13/448,839) Office action, mail date is Jan. 17, 2014.
Korea (10-2012-0036685) Office action, mail date is Jul. 17, 2013.
Korea (10-2012-0036686) Office action, mail date is Jul. 17, 2013.
U.S.A. (U.S. Appl. No. 13/448,839) Office action, mail date is Apr. 24, 2014.
Taiwan Office action (101109436), dated Jan. 24, 2014 along with an english translation thereof.
Taiwan Office action (101109439), dated Jan. 24, 2014 along with an english translation thereof.
Japan (JP Appl. No. 2011-236483) Office action, mail date is Jul. 15, 2014.
Japan (JP Appl. No. 2011-236482) Office action, mail date is Jul. 15, 2014.
U.S.A. (U.S. Appl. No. 13/448,839) Office action, mail date is Sep. 12, 2014.
Taiwan Office Action, mail date is Aug. 28, 2014.

* cited by examiner ially mounted for testing an integrated circuit device or other electronic circuit device which is formed in the die chip.

TEST CARRIER

TECHNICAL FIELD

The present invention relates to a test carrier on which a die chip is temporarily mounted for testing an integrated circuit device or other electronic circuit device which is formed in the die chip.

The present application claims priority from Japanese Patent Application No. 2011-93867 filed on Apr. 20, 2011 and Japanese Patent Application No. 2011-236483 filed on Oct. 27, 2011. The contents described and/or illustrated in the documents relevant to the Japanese Patent Application No. 2011-93867 and Japanese Patent Application No. 2011-236483 will be incorporated herein by reference as a part of the description and/or drawings of the present application.

BACKGROUND ART

Known in the art is a test carrier which has a contact sheet which comprises a film on which contact pads and interconnect patterns are formed, the film is composed of a polyimide, the contact pads correspond to electrode patterns of the chip under test, and the interconnect patterns are connected to the contact pads and are used for contact with an external test system (for example, see PLT 1).

CITATIONS LIST

Patent Literature

PLT 1: Japanese Patent Publication (A) No. 7-263504

SUMMARY OF INVENTION

Technical Problem

However, when bumps which should not be contacted at the time of a test are formed on a chip, there was the problem that the film of the above contact sheet would end up contacting the bumps.

The problem to be solved by the present invention is the provision of a test carrier which can avoid contact with the bumps of an electronic device.

Solution to Problem

[1] The test carrier according to the present invention is a test carrier which comprises: a film-shaped first member which has a first bump which contacts a pad of an electronic device; and a second member which is superposed over the first member, wherein the test carrier holds the electronic device between the first member and the second member, and the first bump is relatively higher than a second bump which the electronic device has.

[2] In the above invention, the first member may have a first dummy bump which contacts a first region which is positioned between a plurality of the second bumps in the surface of the electronic device.

[3] In the above invention, the first member may have a second dummy bump which contacts a second region which is positioned near an outer circumference in the surface of the electronic device.

[4] In the above invention, the electronic device under test may be a die which is diced from a semiconductor wafer.

[5] In the above invention, a holding space which is formed between the first member and the second member and which holds the electronic device may be reduced in pressure compared with the outside air.

Advantageous Effects of Invention

In the present invention, the height of the first bumps of the first member is relatively higher than the second bumps of the electronic device, so it is possible to avoid the first member contacting the second bumps.

DESCRIPTION OF EMBODIMENTS

Below, an embodiment of the present invention will be explained based on the drawings.

Figure 1:
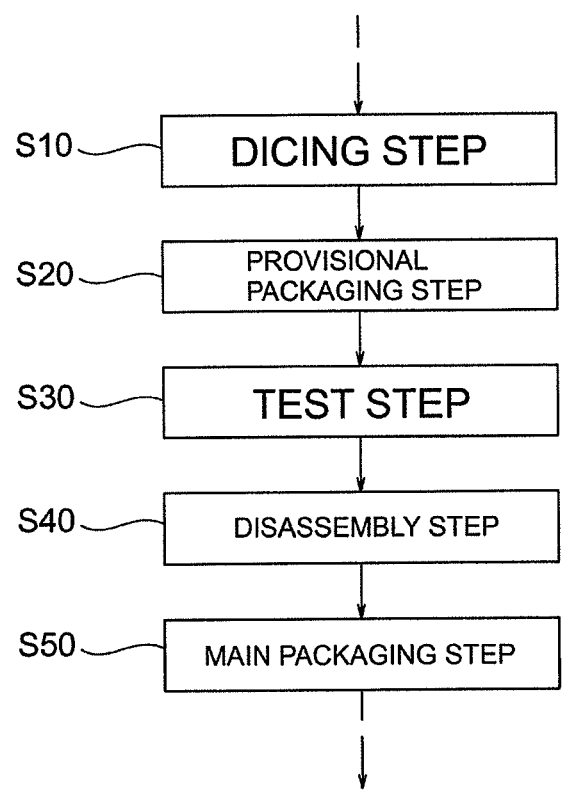
FIG. 1 is a flowchart which shows part of a process of production of a device in an embodiment of the present invention.

FIG. 1 is a flowchart showing part of a process of production of a device in the present embodiment.

In the present embodiment, after a semiconductor wafer is diced (after step S10 of FIG. 1) and before final packaging (before step S50), an electronic circuit which is built into the die 90 is tested (steps S20 to S40).

In the present embodiment, first, the die 90 is temporarily mounted on a test carrier 10 (step S20) by a carrier assembly system (not shown). Next, through this test carrier 10, the die 90 is electrically connected to a test system (not shown) to thereby run a test on the electronic circuit formed in the die 90 (step S30). Further, after this test is finished, the die 90 is taken out from the test carrier 10 (step S40), then this die 90 is packaged by main packaging whereby the device is completed as a final product (step S50).

Below, a test carrier 10 on which a die 90 is temporarily mounted (provisionally packaged) in the present embodiment will be explained while referring to FIG. 2 to FIG. 6. FIG. 2 to FIG. 6 are views which show a test carrier in the present embodiment.

Figure 2:
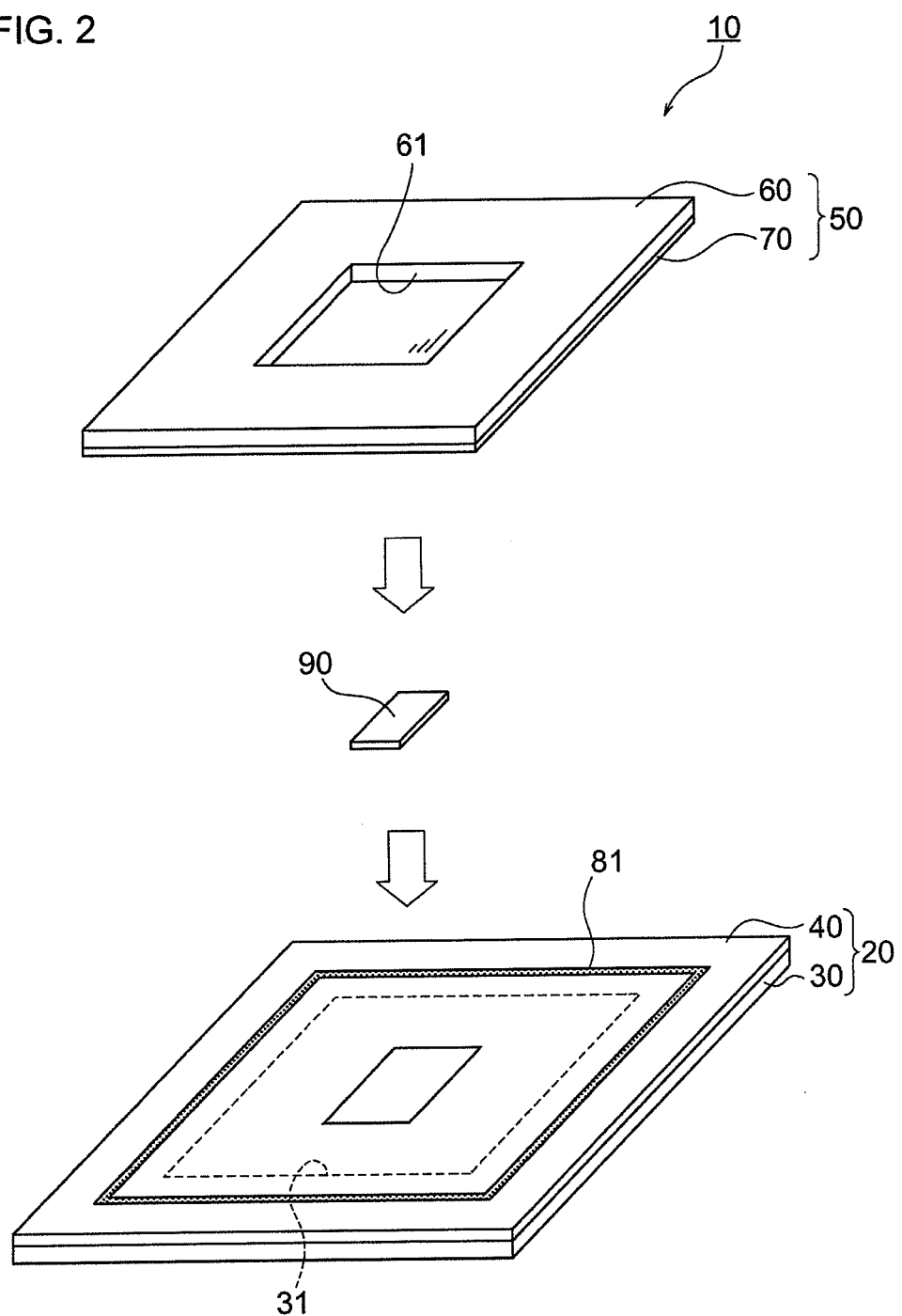
FIG. 2 is a disassembled perspective view of a test carrier in an embodiment of the present invention.
Figure 3:
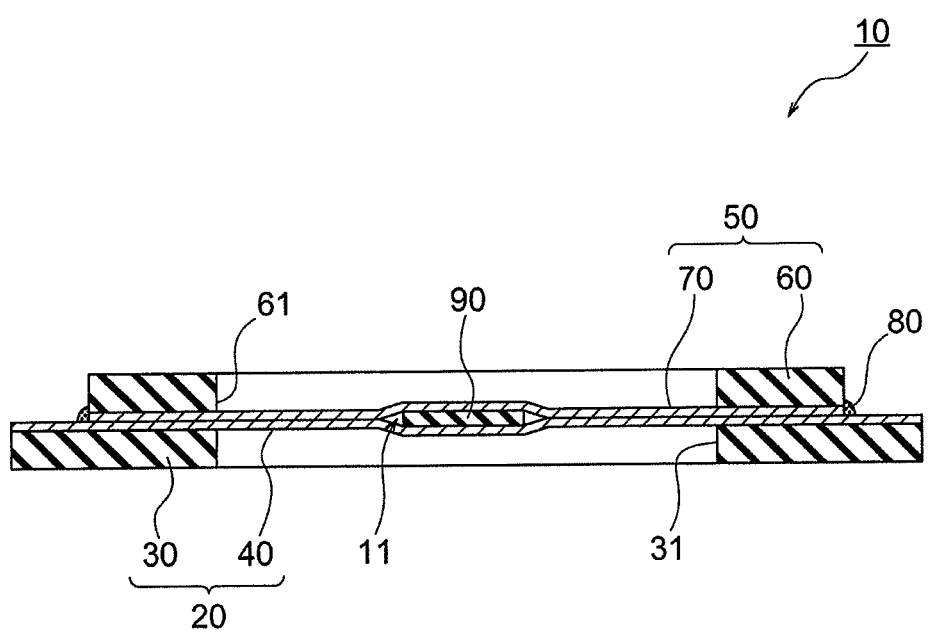
FIG. 3 is a cross-sectional view of a test carrier in an embodiment of the present invention.
Figure 4:
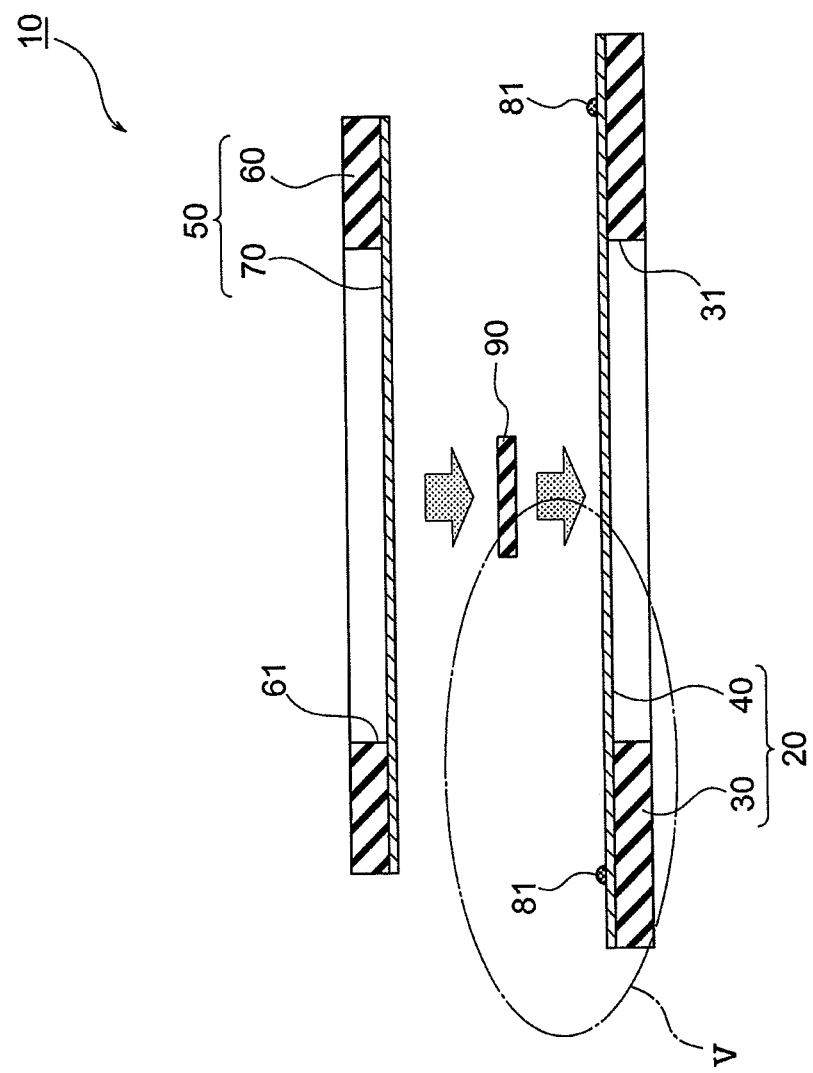
FIG. 4 is a disassembled cross-sectional view of a test carrier of an embodiment of the present invention.

The test carrier 10 in the present embodiment, as shown in FIG. 2 to FIG. 4, comprises: a base member 20 on which a die 90 is to be placed; and a cover member 50 which is covered over this base member 20. This test carrier 10 holds the die 90 by clamping the die 90 between the base member 20 and the cover member 50 in a state reduced in pressure from atmospheric pressure.

The base member 20 comprises a base frame 30 and a base film 40. The base film 40 in the present embodiment corresponds to one example of the first member in the present invention.

The base frame 30 is a rigid board which has a high rigidity (at least a rigidity higher than the base film 40 and the cover film 70) and which is formed with an opening 31 at its center. As the material forming this base frame 30, for example, a polyamide imide resin, ceramic, glass, etc. may be mentioned.

On the other hand, the base film 40 is a film which has pliability and is adhered to the entire surface of the base frame 30, including the center opening 31, by a binder (not shown). In this way, in the present embodiment, the base film 40 which has pliability has the highly rigid base frame 30 adhered to it, so the handling ability of the base member 20 is improved. Note that it is also possible to omit the base frame 30 and use just the base film 40 to form the base member 20.

Figure 5:
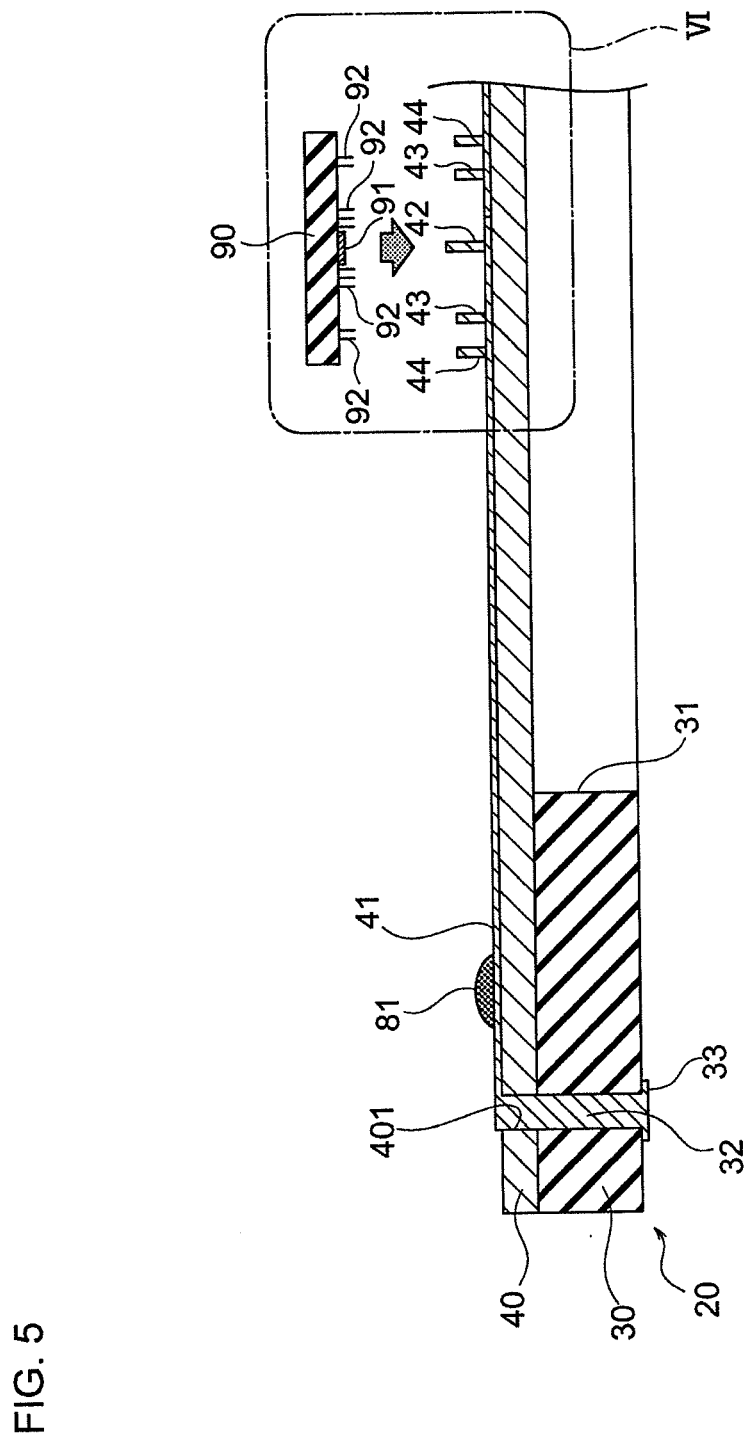
FIG. 5 is an enlarged view of part V in FIG. 4.

The base film 40 comprises, for example, a polyimide film. As shown in FIG. 5, interconnect patterns 41 are formed on its surface. The interconnect patterns 41 are, for example, formed by etching a copper foil which is laminated on the base film 40. Note that, this base film 40 may also have a cover layer which comprises, for example, a polyimide film etc., laminated on it so as to protect the interconnect patterns 41. Further, all or part of the interconnect patterns 41 may be formed in real time on the surface of the base film 40 by ink jet printing.

Figure 6:
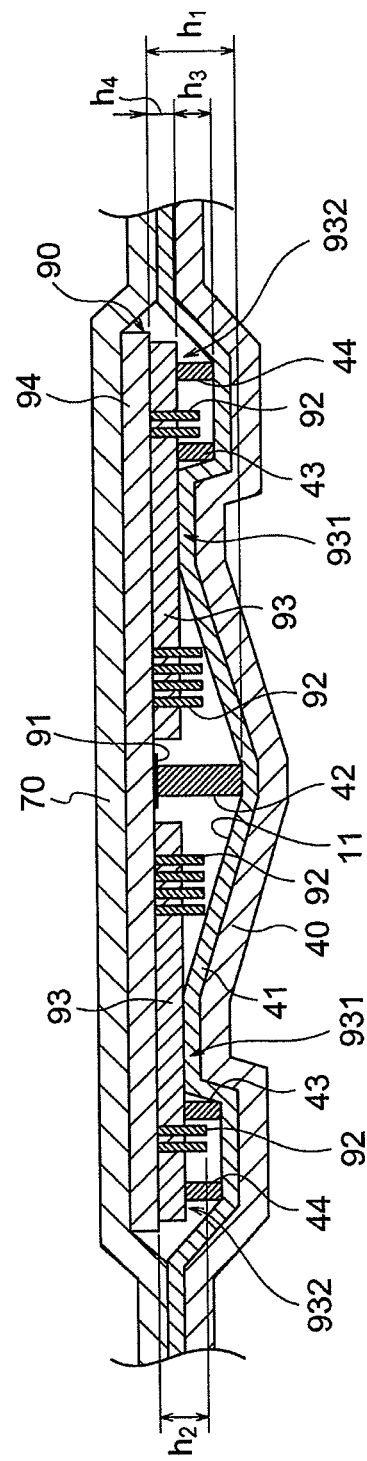
FIG. 6 is an enlarged view of part VI of FIG. 5 and shows the state after assembly and pressure reduction of the test carrier.

As shown in FIG. 5, first bumps 42 which are connected to the test pads 91 of the die 90 are uprightly provided at first ends of the interconnect patterns 41. The first bumps 42 are, for example, composed of copper (Cu), nickel (Ni), etc. and are, for example, formed on the interconnect patterns 41 by the semi-additive process. The first bumps 42 are arranged so as to correspond to the test pads 91 of the die 90. In the present embodiment, as shown in FIG. 6, the height $h_1$ of the first bumps 42 is relatively higher than the height $h_2$ of the second bumps 92 which are formed on the die 90 ($h_1 > h_2$). Note that, FIG. 6 shows the state after assembly and reduction of pressure of the test carrier.

As shown in FIG. 6, in the die 90, the test pads 91 are formed on the silicon substrate 94 and are exposed from the passivation film 93. On the other hand, the second bumps 92 are uprightly provided on the silicon substrate 94 so as to pass through the passivation film 93. As explained above, the height of the second bumps 92 from the surface of the silicon substrate 94 is $h_2$. The second bumps 92 are bumps which should be made not to contact the base film 40 when mounting the die 90 on the test carrier 10.

The height $h_1$ of the first bumps 42 is, for example, set on the basis of the height $h_2$ of the second bumps 92, the distance from the test pads 91 to the first regions 931 (explained later) on the passivation film 93, the rigidity of the base film 40, and the pressure inside of the holding space 11, etc.

Further, in the present embodiment, first dummy bumps 43 and second dummy bumps 44 are provided uprightly on the interconnect patterns 41. The height $h_3$ of the first and second dummy bumps 43 and 44 is relatively larger than the value of the height $h_2$ of the second bumps 92 of the die 90 minus the thickness $h_4$ of the passivation film 94 ($h_3 > h_2 - h_4$).

The first dummy bumps 43 are formed so as to correspond to the first regions 931 which are positioned between the plurality of second bumps 92 in the surface of the passivation film 93 and are designed to avoid contact with the second bumps 92. On the other hand, the second dummy bumps 44 are formed so as to correspond to the second regions 932 which are positioned near the outer circumference in the surface of the passivation film 93.

As the material which forms the first and the second dummy bumps 43 and 44, for example, a metal, a plastic material, etc. may be mentioned, but the material is not particularly limited so long as not damaging the passivation film 93. Further, in the example which is shown in FIG. 6, the first and second dummy bumps 43 and 44 have columnar shapes, but the shapes of the first and second dummy bumps 43 and 44 are not particularly limited to this. Further, the first and second dummy bumps 43 and 44 may be formed on the base film 40 instead of the interconnect patterns 41.

Figure 7:
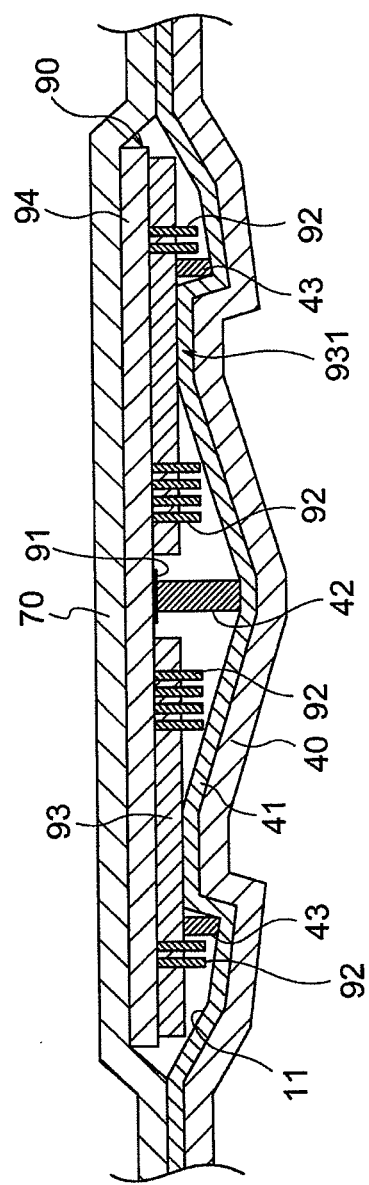
FIG. 7 is an enlarged view of a test carrier in another embodiment of the present invention.

Note that, as shown in FIG. 7, the second dummy bumps 44 may also be omitted. FIG. 7 is an enlarged view of a test carrier in another embodiment of the present invention. As shown in FIG. 7, when the base film 40 has a predetermined rigidity and the base film 40 does not contact the silicon substrate 94 which is exposed from the outer circumferential edges of the passivation film 93, the second dummy bumps 44 may be omitted.

The first bumps 42 in the present embodiment correspond to one example of the first bumps in the present invention, the first dummy bumps 43 in the present embodiment correspond to one example of the first dummy bumps in the present invention, and the second dummy bumps 44 in the present embodiment correspond to one example of the second dummy bumps in the present invention. Further, the test pads 91 in the present embodiment correspond to one example of the pads in the present invention, while the second bumps 92 in the present embodiment correspond to one example of the second bumps in the present invention.

Returning to FIG. 5, through holes 32 are formed at positions of the base frame 30 corresponding to the other ends of the interconnect patterns 41. The interconnect patterns 41 are connected to the through holes 32 through openings 401 which are formed in the base film 40. The through holes 32 are connected to external terminals 33 which are formed on the bottom surface of the base frame 30. The external terminals 33 are contacted by contactors (not shown) of the test system when testing an electronic circuit which is built into the die 90.

As shown in FIG. 2 to FIG. 4, the cover member 50 comprises a cover frame 60 and a cover film 70. The cover film 70 in the present embodiment corresponds to one example of the second member in the present invention.

The cover frame 70 is a rigid board which has a high rigidity (at least a rigidity which is higher than the base film 40 or the cover film 70) and which is formed with an opening 61 at its center. In the present embodiment, this cover frame 60 also, like the above-mentioned base frame 30, is composed of, for example, a polyamide imide resin, ceramic, glass, etc.

On the other hand, the cover film 70 is a film which has pliability and is attached by a binder (not shown) to the entire surface of the cover frame 60 including the center opening 61. In the present embodiment, the cover film 70 which has pliability has the high rigidity cover frame 60 adhered to it, so the handling ability of the cover member 50 is improved. Note that, the cover member 50 may also comprise just the cover film 70 as well. Alternatively, the cover member 60 may comprise just a rigid board which is not formed with an opening 61.

The above explained test carrier 10 is assembled as follows.

First, the test pads 91 are positioned with the first bumps 42 and, in that state, the die 90 is placed on the base film 40 of the base member 20.

At this time, as shown in FIG. 6, the first dummy bumps 43 abut against the first regions 931 of the die 90 and the second dummy bumps 44 abut against the second regions 932 of the die 90.

Next, in an environment reduced in pressure compared with atmospheric pressure, the cover member 50 is placed on the base member 20 and the die 90 is inserted between the base member 20 and the cover member 50. At this time, the cover member 50 is placed over the base member 20 so that the base film 40 of the base member 20 and the cover film 70 of the cover member 50 directly contact each other.

Incidentally, while not particularly shown, when the die 90 is relatively thick, the cover member 50 may be laid over the base member 20 so that the base frame 30 and the cover frame 60 directly contact each other.

Next, in the state with the die 90 clamped between the base member 20 and the cover member 50, the test carrier 10 is returned to an atmospheric pressure environment whereby the die 90 is held inside the holding space 11 which is formed between the base member 20 and the cover member 50.

Note that, the test pads 91 of the die 90 and the first bumps 42 of the base film 40 are not fastened by solder etc. In the present embodiment, the holding space 11 is reduced in pressure compared with the atmospheric pressure, so the die 90 is pressed against by base film 40 and the cover film 70 whereby the test pads 91 of the die 90 and the first bumps 42 of the base film 40 contact each other.

Further, since the holding space 11 becomes a negative pressure compared with atmospheric pressure, as shown in FIG. 6, the base film 40 is pulled toward the die 90, but in the present embodiment, the height $h_1$ of the first bumps 42 is relatively higher than the height $h_2$ of the second bumps 92 ($h_1 > h_2$), so the first bumps 42 function as supports which support the base film 40 and the base film 40 broadens to become umbrella shapes about the first bumps 42. For this reason, in the present embodiment, it is possible to avoid the second bumps 92 which are positioned around the test pads 91 from contacting the base film 40 and possible to prevent deformation of the second bumps 92.

Similarly, in the present embodiment, the height $h_3$ of the first dummy bumps 43 is relatively larger than the value of the height $h_2$ of the second bumps 92 of the die 90 minus the thickness $h_4$ of the passivation film 94 ($h_3 > h_2 - h_4$), so it is possible to avoid the second bumps 92 which are positioned at locations away from the test pads 91 from contacting the base film 40 and possible to prevent deformation of the second bumps 92.

Furthermore, in the present embodiment, due to the second dummy bumps 44, it is possible to prevent the interconnect patterns 41 of the base film 40 from contacting the end faces of the silicon substrate 94 of the die 90 which are exposed from the passivation film 93 and possible to prevent the interconnect patterns 41 from short-circuiting. Note that, the height of the second dummy bumps 44 is not particularly limited to the above $h_3$ so long as the interconnect patterns 41 do not contact the silicon substrate 94.

Note that, as shown in FIG. 3, the base member 40 and the cover member 50 may be fastened to each other by a bonded part 90 so as to prevent positional deviation and improve adhesion. As the binder 81 which forms the bonded part 80, for example, a UV curing type binder may be illustrated.

This binder 81, as shown in FIG. 2 and FIG. 4 to FIG. 5, is coated on the base member 20 at positions corresponding to the outer circumference of the cover member 50, the cover member 50 is placed over the base member 20, then UV light is fired to cause the binder 81 to cure whereby the bonded part 80 is formed.

Note that the embodiments explained above were described for facilitating understanding of the present invention and were not described for limiting the present invention. Therefore, the elements disclosed in the above embodiments include all design modifications and equivalents falling under the technical scope of the present invention.

For example, in the above embodiments, the interconnect patterns 41 were formed on only the base film 40, but they may also be formed on the cover film 70 in addition to the base film 40. Further, in the above embodiments, the external terminals 33 were formed on the base frame 30, but the invention is not particularly limited to this. They may also be formed on the base film 40, the cover frame 60, or the cover film 70.

REFERENCE SIGNS LIST

10 . . . test carrier
11 . . . holding space
20 . . . base member
30 . . . base frame
40 . . . base film
41 . . . interconnect patterns
42 . . . first bump
43 . . . first dummy bump
44 . . . second dummy bump
50 . . . cover member
60 . . . cover frame
70 . . . cover film
90 . . . die
91 . . . test pad
92 . . . second bump
93 . . . passivation film
931 . . . first region
932 . . . second region
94 . . . silicon substrate

The invention claimed is:

1. A test carrier which comprises:
a film-shaped first member which has a first bump which contacts a pad of an electronic device; and
a second member which is superposed over the first member, wherein
the test carrier holds the electronic device between the first member and the second member,
a height of the first bump is greater than a height of a second bump which the electronic device has,
an end of the second bump which is at the side of the first member is in a non-contact state with the first member, and
the height of the second bump is greater than a height of the pad.

2. The test carrier as set forth in claim 1,
wherein the electronic device under test is a die which is diced from a semiconductor wafer.

3. The test carrier as set forth in claim 1,
wherein a holding space which is formed between the first member and the second member and which holds the electronic device is reduced in pressure compared with the outside air.

4. A test carrier which comprises:
a film-shaped first member which has a first bump which contacts a pad of an electronic device; and
a second member which is superposed over the first member, wherein
the test carrier holds the electronic device between the first member and the second member,
a height of the first bump is greater than a height of a second bump which the electronic device has,
an end of the second bump which is at the side of the first member is in a non-contact state with the first member, and
the first member has a first dummy bump which contacts a first region which is positioned between a plurality of the second bumps in the surface of the electronic device.

5. A test carrier which comprises:
a film-shaped first member which has a first bump which contacts a pad of an electronic device; and
a second member which is superposed over the first member, wherein
the test carrier holds the electronic device between the first member and the second member,
a height of the first bump is greater than a height of a second bump which the electronic device has,
an end of the second bump which is at the side of the first member is in a non-contact state with the first member, and
the first member has a second dummy bump which contacts a second region which is positioned near an outer circumference in the surface of the electronic device.

* * * * *